US010050169B2

(12) United States Patent
Guter et al.

(10) Patent No.: US 10,050,169 B2
(45) Date of Patent: Aug. 14, 2018

(54) STACKED OPTOCOUPLER COMPONENT

(71) Applicant: AZUR SPACE Solar Power GmbH, Heilbronn (DE)

(72) Inventors: Wolfgang Guter, Stuttgart (DE); Daniel Fuhrmann, Heilbronn (DE); Clemens Waechter, Lauffen am Neckar (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/131,121

(22) Filed: Apr. 18, 2016

(65) Prior Publication Data

US 2016/0308085 A1   Oct. 20, 2016

(30) Foreign Application Priority Data

Apr. 17, 2015   (EP) .................................... 15001126

(51) Int. Cl.
*H01L 25/16* (2006.01)
*H01L 31/167* (2006.01)
(Continued)

(52) U.S. Cl.
CPC .......... *H01L 31/167* (2013.01); *H01L 25/167* (2013.01); *H01L 27/0814* (2013.01);
(Continued)

(58) Field of Classification Search
CPC ... H01L 31/0352; H01L 31/167; H01L 33/20; H03K 17/78
See application file for complete search history.

(56) References Cited

U.S. PATENT DOCUMENTS 4,127,862 A  *  11/1978  Ilegems .............. G02B 6/4202
                                                  136/249
4,766,471 A  *  8/1988  Ovshinsky .......... H01L 29/7391
                                                  250/551
(Continued)

FOREIGN PATENT DOCUMENTS

DE   33 17 054 A1   11/1984
DE   36 33 181 A1    4/1988
(Continued)

OTHER PUBLICATIONS

Extended European Search Report in German language, dated Oct. 12, 2016.

*Primary Examiner* — Raj R Gupta
(74) *Attorney, Agent, or Firm* — Muncy, Geissler, Olds & Lowe, P.C.

(57) ABSTRACT

A stacked optocoupler component, having a transmitter component with a transmitting area and a receiver component with a receiving area and a plate-shaped electrical isolator. The isolator is formed between the transmitter component and the receiver component, and the transmitter component and the receiver component and the isolator are arranged one on top of another in the form of a stack. The transmitter component and the receiver component are galvanically separated from one another but optically coupled to one another. The isolator is transparent for the emission wavelengths of the transmitter component and the centroidal axis of the transmitting area and the centroidal axis of the receiving area are substantially or precisely parallel to one another.

25 Claims, 1 Drawing Sheet

(51) Int. Cl.
  *H01L 33/20* (2010.01)
  *H01L 33/60* (2010.01)
  *H01S 5/18* (2006.01)
  *H03K 17/78* (2006.01)
  *H01L 31/0304* (2006.01)
  *H01L 27/08* (2006.01)
  *H01L 29/88* (2006.01)
  *H01L 31/0352* (2006.01)
  *H01L 33/30* (2010.01)
  *H01S 5/022* (2006.01)
  *H01S 5/30* (2006.01)

(52) U.S. Cl.
  CPC ........ *H01L 29/88* (2013.01); *H01L 31/03046* (2013.01); *H01L 31/0352* (2013.01); *H01L 33/20* (2013.01); *H01L 33/30* (2013.01); *H01L 33/60* (2013.01); *H01S 5/022* (2013.01); *H01S 5/18* (2013.01); *H01S 5/3013* (2013.01); *H03K 17/78* (2013.01); Y02E 10/544 (2013.01); Y02P 70/521 (2015.11)

(56) References Cited

U.S. PATENT DOCUMENTS

| | | |
|---|---|---|
| 4,857,746 A | 8/1989 | Kuhlmann et al. |
| 4,996,577 A | 2/1991 | Kinzer |
| 2003/0106580 A1 | 6/2003 | Lizotte |
| 2006/0006955 A1 | 1/2006 | Arisawa |
| 2006/0048811 A1* | 3/2006 | Krut .............. H01L 31/0687 136/249 |
| 2007/0023771 A1* | 2/2007 | Kim .............. H01L 33/387 257/94 |
| 2008/0173879 A1* | 7/2008 | Monaco ............ H01L 25/167 257/84 |
| 2014/0042344 A1 | 2/2014 | Maasi et al. |
| 2014/0212085 A1* | 7/2014 | Margaritis ........... H01L 24/11 385/14 |
| 2014/0284629 A1 | 9/2014 | Takai et al. |

FOREIGN PATENT DOCUMENTS

| | | |
|---|---|---|
| DE | 40 05 835 A1 | 8/1990 |
| DE | 287 356 A5 | 2/1991 |
| DE | 196 38 194 A1 | 4/1998 |
| DE | 100 11 258 A1 | 9/2001 |
| JP | S 58-7886 A | 1/1983 |
| JP | H 03-68177 A | 3/1991 |
| JP | H 06-45636 A | 2/1994 |
| JP | 3816114 B2 | 8/2006 |
| JP | 2015-029037 A | 2/2015 |

* cited by examiner

STACKED OPTOCOUPLER COMPONENT

This nonprovisional application claims priority under 35 U.S.C. § 119(a) to European Patent Application No. 15001126.0, which was filed in Europe on Apr. 17, 2015, and which is herein incorporated by reference.

BACKGROUND OF THE INVENTION

Field of the Invention

The invention relates to a stacked optocoupler component.

Description of the Background Art

Various optocoupler components are known from DE 100 11 258 A1, US 2014 004 234 4 A1, US 2014 021 208 5 A1, DE 33 17 054 A1, US 2006 006 095 5 A1, U.S. Pat. No. 4,127,862, DE 3 633 181 A1, and U.S. Pat. No. 4,996,577.

SUMMARY OF THE INVENTION

It is therefore an object of the invention to provide a device that refines the prior art.

According to an exemplary embodiment of the invention, a stacked optocoupler component is provided which has a transmitter component with a transmitting area, whereby the transmitting area has a surface, and a receiver component with a receiving area, whereby the receiving area has a surface, and a plate-shaped electrical isolator, whereby the isolator is formed between the transmitter component and receiver component, and the transmitter component and receiver component and the isolator are arranged one on top of another in the form of a stack, and the isolator has a top side and a bottom side. The transmitter component and receiver component are separated galvanically from one another but optically coupled to one another, whereby the isolator is transparent at least for a part of the emission wavelengths of the transmitter component, and the centroidal axis of the surface of the transmitting area and the centroidal axis of the surface of the receiving area are substantially or precisely parallel to one another, and the offset between the two centroidal axes is less than half or less than a tenth or less than a fiftieth of the distance of the particular centroidal axes to an outer edge of the surface of the transmitting area or to an outer edge of the surface of the receiving area, so that the light of the transmitter component acts predominantly or solely through the isolator on the receiver component or on the surface of the receiving area and on the receiving area, and the isolator projects on all sides from the stack in the form of a balcony, and the receiver component has a number N of partial voltage sources connected in series to one another, whereby N is a natural number and N≥2, and the deviation of the partial voltages of the individual partial voltage sources from one another is less than 20%, and each partial voltage source has a semiconductor diode with a p-n junction, and a tunnel diode is formed between two successive partial voltage sources, whereby the partial voltage sources and the tunnel diodes are monolithically integrated together.

It should be noted that in the present case the term centroidal axis of the surface is taken to mean the normal of the surface at the center of gravity of the surface. Stated differently, if the centroidal axes of two surfaces are parallel, the surfaces assigned in each case are also parallel to one another, whereby in the present case the surfaces are to be regarded as planar or nearly planar. If in the present case there is no distance between the two centroidal axes parallel to one another, both surface centroids, when viewed in the direction of the stack, are arranged precisely one above the other. In particular, the surfaces are made quadrangular, preferably square, and most preferably rectangular. It should be noted that in the present case the term surface preferably refers to a planar surface, in particular without a contact system or metallization.

It is also understood that the electron hole pairs generated by the irradiation of light are separated by means of the p-n junction of the semiconductor diodes and hereby the particular partial voltage is produced, as a result of which the partial voltage always is an electrochemical potential difference. Preferable, an intrinsically doped layer can also be disposed between the p and n layer.

It should also be noted that the term plate-shaped is understood to be a plate with preferably two parallel and in each case planar plate areas, whereby the planar areas are formed on the top side and bottom side of the plate.

Furthermore, the transmitter component and receiver component are present in the form of so-called "dies," i.e., as unpackaged components. Further, the transmitter component also has a rear side, aside from the transmitting area, and the receiver component also has a rear side, aside from the receiving area. Stated differently, the transmitter component and the receiver component are arranged as dies each preferably directly on or below the isolator. Overall, the entire stack can be an unpackaged component. It should be noted, furthermore, that the number N can be equal to four.

The term 'transparent' can mean a low absorption at least in the range of the transmission wavelengths. The absorption in regard to the irradiated intensity can be less than 20% or less than 10%, most preferably less than 5%.

In the receiver component, more precisely in the receiving area, the semiconductor diodes among themselves can have a substantially similar or a precisely similar sequence of semiconductor layers with identical or substantially identical semiconductor materials and due to the series connection of the diodes, the total voltage of the receiver component is the sum of the partial voltages. As a result, an almost identical partial voltage of the particular semiconductor diodes can be achieved in a simple way. Preferably, the partial voltages deviate by less than 10% from one another between any two semiconductor diodes in the stack. With an increasing distance of the individual diode from the isolator, the thickness of the absorption region and herewith the total thickness of the individual diode can increase greatly, preferably exponentially.

An advantage is that very compact and small optocoupler components can be produced by the novel stacked arrangement of a plurality of monolithic diodes in the receiver component in association with a high light sensitivity. In particular, a direct coupling of the emitted light can be achieved; i.e., the light needs to traverse a short path through the isolator before the transmitted light strikes the receiver component.

A further advantage is that the receiver component, aside from a high voltage, preferably above 2 V, most preferably above 4 V, also makes available a high current above 1 mA/cm$^2$, most preferably above 100 mA/cm$^2$. As a result, high switching speeds above 10 MHz, preferably above 100 MHz, can be achieved.

It should be noted, furthermore, that it is advantageous to connect the transmitting area directly to the top side of the isolator and the receiving area directly to the bottom side of the isolator, so that the transmitting area faces the receiving area. As a result, the emitted light requires only the minimal path to the receiving surface, i.e., to the surface of the receiving area.

In an alternative embodiment, the rear side of the transmitter component is connected to the top side of the isolator and the rear side of the receiver component to the bottom side of the isolator. An advantageous stacked design can be obtained by forming a substrate layer on the rear side of the transmitter component and by forming a substrate layer on the rear side of the receiver component. In other words, the two substrate layers in the present case can face one another directly. With the formation of the substrate layers, the mechanical stability of the particular component can be increased and reliable contacting of the components can be carried out.

In an embodiment, the stack comprising the transmitter component and isolator and the receiver component can be integrated into a mutual package.

In an embodiment, the receiver component and transmitter component can have a truncated pyramidal design along the stack direction, whereby the difference in surface area between the bottom side of the truncated pyramid and the top side of the truncated pyramid can be at least 5 µm².

In an embodiment, the difference between the size of the surface of the transmitting area and the size of the surface of the receiving area can be less than 20%, preferably less than 10%. It is advantageous to make the surface of the receiving area either as large as the surface of the transmitting area, or alternatively to make the surface of the receiving area at most 20% larger than the surface of the transmitting area.

The entire surface of the transmitting area and/or the transmitting area emit light and the entire surface of the receiving area and the receiving area overall absorb light. As a result, the efficiency of the optocoupler component can be increased. When light is emitted through the surface of the transmitting area, the smallest possible area is covered with contact metal. The same applies to the case of absorption. Here as well, in the case of absorption of light through the surface of the receiving area and in the receiving area, it applies that the smallest possible area or a portion of the entire surface of the receiving area is covered with contact metal.

In an embodiment, the surface of the transmitting area and the surface of the receiving area can have a rectangular shape, whereby the largest edge length of the particular rectangle is less than 2 mm. In an embodiment, the surfaces of the transmitting area and the surface of the receiving area are made square and each has a base area larger than 0.2×0.2 mm² and smaller than 4 mm² or smaller than 1 mm².

The surfaces of the transmitting area and the surface of the receiving area each can have a strip-like or grid-shaped or small contact area with a proportion of less than 10% of the entire surface or a full-surface metallization. Further, the rear side of the transmitter component and also the rear side of the receiver component can have a strip-like contact area or grid-shaped contact area or a small contact area with a proportion of less than 10% of the entire surface or a full-surface metallization.

In an embodiment, the transmitter component has an optical mirror for the wavelength of the transmitter or an RCLED or a surface-emitting laser.

The plate-shaped isolator can comprises a plastic and/or glass and/or aluminum dioxide and/or epoxy resin and/or silicone or have a compound of this type. This also includes a multilayer structure made of different materials. In particular, for example, the two components, therefore the transmitter component and receiver component, can be connected frictionally to a thin glass plate with a thin connecting layer, made as a transparent silicone adhesive layer. In order to form a stack, the transmitter component and receiver component can be joined to the isolator by means of other connecting materials and/or a fastener as well.

In an embodiment, the thickness of the isolator can be less than 0.5 mm, preferably less than 0.3 mm, but greater than 50 µm. The thickness of the isolator can be selected so that a dielectric strength between the transmitter component and receiver component greater than 2 kV is assured. It is advantageous hereby if the plate-shaped isolator projects on all sides from the stack by at least 5 µm; i.e., the isolator forms a peripheral balcony, whereby the balcony preferably projects at most 250 µm.

In an embodiment, the total thickness of the stack made up of a transmitter component and isolator and receiver component when unpackaged is less than 3 mm, preferably less than 2 mm, most preferably less than 1.2 mm, but thicker than 0.2 mm.

To increase the coupling efficiency between the transmitter component and receiver component, it is advantageous that the emission wavelength of the transmitter component is the same or at most 10% smaller than the absorption edge of the receiver component. In an embodiment, the transmitter component and receiver component comprise a III-V material or has the III-V material. In particular, the receiver component comprises a GaAs and/or a Ge substrate. Preferably, the receiver component comprises an (Al)GaAs and/or an InGaP and/or an InGaAs material. It should be noted that an element placed in parentheses, here, for example, aluminum, can be but need not be present.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
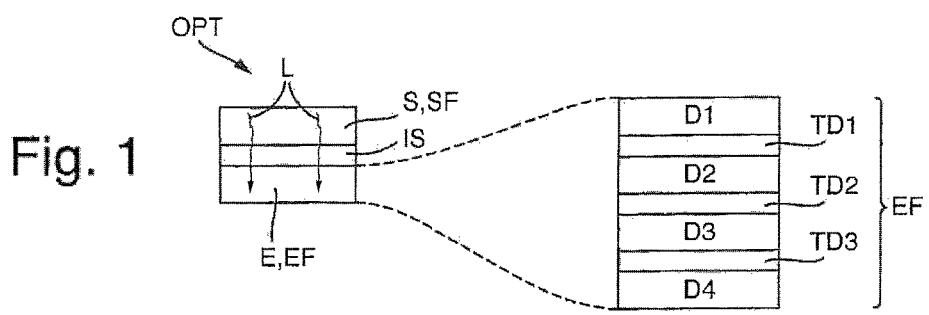
FIG. 1 shows a cross-sectional view of an embodiment of the invention with an enlarged detail.

The illustration in FIG. 1 shows a cross-sectional view of a first embodiment of the invention of a stacked optocoupler component OPT together with an enlarged detail. Optocoupler component OPT comprises a transmitter component S with a transmitting area SF with a surface and a receiver component E with a receiving area EF and with a surface.

The enlarged detail shows a basic structure of a receiving area EF. In the present case, the surface area of receiving area EF and of receiver component E is identical to the surface area of transmitting area SF and of transmitter component S. Furthermore, optocoupler component OPT comprises a plate-shaped electrical isolator IS, whereby isolator IS is formed between transmitter component S and receiver component E.

Overall, transmitter component S and receiver component E and isolator IS are arranged one on top of the other in the form of a stack and connected frictionally to one another, whereby transmitter component S and receiver component E are galvanically separated from one another but optically coupled to one another. Isolator IS is transparent at least for the emission wavelengths of transmitter component S. The three components S, IS, and E are arranged such that the centroidal axis of the surface of transmitting area SF and the centroidal axis of the surface of receiving area EF are precisely parallel to one another and the two centroid axes do not have an offset. The light L of transmitter component S acts through isolator IS directly on receiver component E.

In the enlarged detail, receiving area EF of receiver component E is shown in detail. From an electrotechnical standpoint, receiver component E has a number of four partial voltage sources connected in series to one another. Each partial voltage source comprises a semiconductor diode D1 to D4. Diodes D1 to D4 have a p-n junction (not shown). A tunnel diode TD1 to TD3 is arranged between two successive partial voltage sources. The partial voltage sources and tunnel diodes TD1 to TD3 are integrated monolithically together. In the case of irradiation through transmitter component S, receiver component E generates a total voltage of more than 2 V, whereby the individual diodes of the stack generate a nearly identical partial voltage.

Figure 2A:
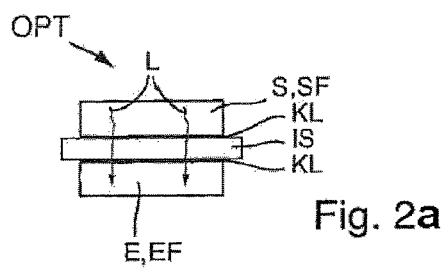
FIG. 2 shows a cross-sectional view of an embodiment of the invention.
Figure 2B:
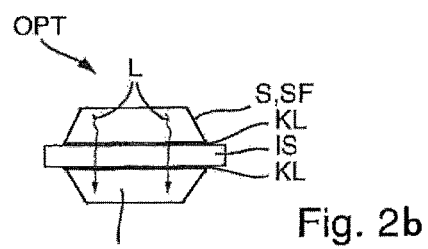

A cross-sectional view of a second embodiment of the invention of an optocoupler component OPT is shown in the illustration in FIG. 2a and FIG. 2b. Only the differences to the embodiment shown in the illustration in FIG. 1 will be described below. The area of plate-shaped isolator IS is greater than the area of transmitter component S and the area of receiver component E, so that isolator IS projects from the stack peripherally in the form of a balcony. A transparent connection layer KL is formed between isolator IS and transmitter component S, on the one side, and isolator IS and receiver component E. Receiver component E and transmitter component S are connected frictionally by means of connection layer KL to isolator IS to form a stack. In FIG. 2b, the receiver E and transmitter S components are shaped as truncated pyramids along the centroidal axis with the difference between the top side and the bottom side of the pyramid layer being at least 5 $\mu m^2$.

Figure 3A:
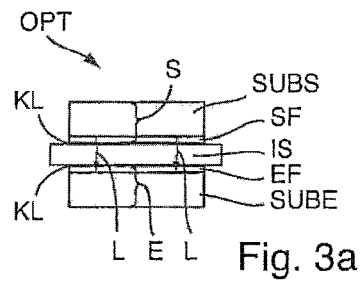
FIG. 3a shows a cross-sectional view of an embodiment of the invention with a substrate.

A cross-sectional view of a third embodiment of the invention of an optocoupler component OPT is shown in the illustration of FIG. 3a. Only the differences to the embodiment shown in the illustration in FIG. 1 and FIG. 2 will be explained below. Transmitter component S comprises a substrate layer SUBS in addition to transmitting area SF. Receiver component E comprises a substrate layer SUBE in addition to receiver area EF. Both substrate layers SUBS and SUBE are formed as support layers. Transmitting area SF and receiving area EF are arranged between the two substrate layers SUBS and SUBE. The likewise transparent connection layer KL is formed in each case on the top side and bottom side of plate-shaped isolator IS. Connection layer KL is thinner than 0.2 mm, preferably thinner than 0.02 mm, and connects the top side of the isolator by material bonding to transmitting area SF and the bottom side of the isolator by material bonding to the receiving area. The advantage of the arrangement is that the light L of transmitting area SF strikes receiving area EF directly through isolator IS.

Figure 3B:
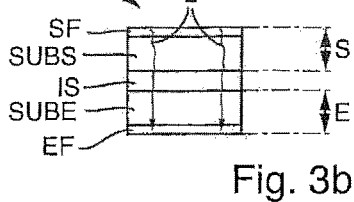
FIG. 3b shows a cross-sectional view of an embodiment of the invention with a substrate.

A cross-sectional view of a fourth embodiment of the invention of an optocoupler component OPT is shown in the illustration of FIG. 3b. Only the differences relative to the embodiment shown in the illustration in FIG. 3a will be explained below. Substrate layer SUBS is arranged between transmitting area SF and isolator IS and substrate layer SUBE between receiving area EF and isolator IS. In the present case, light L also passes through the two substrate layers SUBS and SUBE, in addition to the isolator, in order to be absorbed on receiving area EF. It is understood that substrate layers SUBS and SUBE have a low absorption in the range of the emission wavelengths of transmitter component S.

Figure 4:
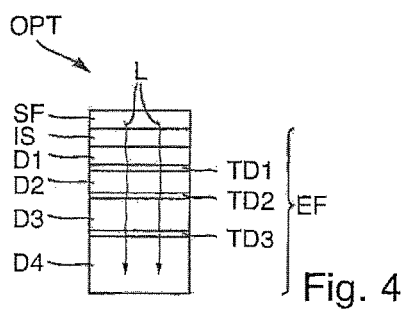
FIG. 4 shows a detailed illustration of the receiver component.

A cross-sectional view of a detailed illustration of receiver component E as part of optocoupler component OPT is shown in the illustration in FIG. 4. Only the differences to the embodiment in FIG. 1 will be explained below. The layer thicknesses of diodes D1 to D4 increase continuously with the distance of the particular diode from isolator IS, the fourth diode D4 having the greatest layer thickness.

Figure 5:
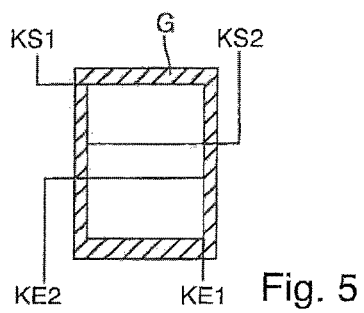
FIG. 5 shows a cross-sectional view of a packaged embodiment.

A cross-sectional view of a packaged embodiment of an optocoupler component OPT is shown in the illustration in FIG. 5. Only the differences to the previous embodiments will be explained below. The stack comprising transmitter component S and isolator IS and receiver component E is integrated into a mutual package G. Transmitter component S has a first electrical connecting contact KS1 and a second electrical connecting contact KS2. Receiver component E has a first electrical connecting contact KE1 and a second electrical connecting contact KE2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A stacked optocoupler component comprising:
   a transmitter component with a transmitting area, the transmitting area having a surface;
   a receiver component with a receiving area, the receiving area having a surface;
   an electrical isolator that is plate-shaped, the electrical isolator being formed between the transmitter component and the receiver component, and the transmitter component and receiver component and the electrical isolator being arranged one on top of another in a form of a stack,
   wherein the transmitter component and receiver component are galvanically separated from one another but optically coupled to one another,
   wherein the electrical isolator is transparent at least for a part of an emission wavelength of the transmitting area,
   wherein a centroidal axis of the surface of the transmitting area and a centroidal axis of the surface of the receiving area are substantially parallel to one another,
   wherein an offset between the two centroidal axes is less than half of a distance of either centroidal axis to an outer edge of the surface of the transmitting area or the receiving area so that light of the transmitter component acts predominantly or solely through the electrical isolator on the receiving area, wherein the electrical isolator projects on all sides from the stack to form a balcony, wherein the receiver component has a number N of partial voltage sources connected in series to one another, N being a natural number greater or equal to 2, wherein a deviation of the partial voltages of the individual partial voltage sources from one another is less than 20%, wherein each partial voltage source has a semiconductor diode with a p-n junction, wherein a tunnel diode is formed between each of two successive partial voltage sources, wherein the partial voltage sources and the tunnel diodes are monolithically integrated together, wherein light from the transmitter component is emitted parallel to the centroidal axis of the surface of the transmitting area, wherein the receiver component receives light directly from the transmitter component across the electrical isolator, wherein a transmitter electrical contact terminal is provided on the surface of the transmitting area, and a receiver electrical contact terminal is provided on the surface of the receiving area, and wherein the transmitter electrical contact terminal and the receiver electrical contact terminal are a strip or grid pattern covering less than 10% of the surface of the transmitting area and the surface of the receiving area.

2. The integrated optocoupler according to claim 1, wherein a difference between a size of the surface of the transmitting area and a size of the surface of the receiving area is less than 20%.

3. A stacked optocoupler component comprising:
a transmitter component with a transmitting area, the transmitting area having a surface;
a receiver component with a receiving area, the receiving area having a surface;
an electrical isolator that is plate-shaped, the electrical isolator being formed between the transmitter component and the receiver component, and the transmitter component and receiver component and the electrical isolator being arranged one on top of another in a form of a stack, wherein the transmitter component and receiver component are galvanically separated from one another but optically coupled to one another, wherein the electrical isolator is transparent at least for a part of an emission wavelength of the transmitting area, wherein a centroidal axis of the surface of the transmitting area and a centroidal axis of the surface of the receiving area are substantially parallel to one another, wherein an offset between the two centroidal axes is less than half of a distance of either centroidal axis to an outer edge of the surface of the transmitting area or the receiving area so that light of the transmitter component acts predominantly or solely through the electrical isolator on the receiving area, wherein the electrical isolator projects on all sides from the stack to form a balcony, wherein the receiver component has a number N of partial voltage sources connected in series to one another, N being a natural number greater or equal to 2, wherein a deviation of the partial voltages of the individual partial voltage sources from one another is less than 20%, wherein each partial voltage source has a semiconductor diode with a p-n junction, wherein a tunnel diode is formed between each of two successive partial voltage sources, wherein the partial voltage sources and the tunnel diodes are monolithically integrated together, wherein light from the transmitter component is emitted parallel to the centroidal axis of the surface of the transmitting area, wherein the receiver component receives light directly from the transmitter component across the electrical isolator, wherein a first transmitter electrical contact terminal is provided on a top side of the transmitter component opposite the surface of the transmitting area, and a second transmitter electrical contact terminal is provided on the surface of the transmitting area, wherein a first receiver electrical contact terminal is provided on the surface of the transmitting area, and a second receiver electrical contact terminal is provided on the surface of the receiving area, and wherein the second transmitter electrical contact terminal and the second receiver electrical contact terminal are a strip or grid pattern covering less than 10% of the surface of the transmitting area and the surface of the receiving area.

4. The integrated optocoupler according to claim 1, wherein the surface of the transmitting area and the surface of the receiving area have a rectangular shape and a largest length from the surface of the transmitting area to the surface of the receiving area is less than 2 mm.

5. The integrated optocoupler according to claim 1, wherein the stack comprising the transmitter component and the isolator and the receiver component is integrated into a mutual package.

6. The integrated optocoupler according to claim 1, wherein the surface of the transmitting area and the surface of the receiving area are substantially equal in size and wherein the transmitting area emits light and the receiving area absorbs light.

7. The integrated optocoupler according to claim 1, wherein the surface of the transmitting area and the surface of the receiving area are square and each has a base area larger than $0.2 \times 0.2$ mm$^2$ and smaller than 4 mm$^2$.

8. The integrated optocoupler according to claim 1, wherein the transmitter component has an optical mirror for the wavelength of the transmitter or an RCLED or a surface-emitting laser.

9. The integrated optocoupler according to claim 1, wherein the plate-shaped isolator is formed of plastic or of glass or of aluminum dioxide or of epoxy resin or of silicone.

10. The integrated optocoupler according to claim 1, wherein the isolator projects on all sides from the stack by at least 5 µm.

11. The integrated optocoupler according to claim 1, wherein the thickness of the isolator is less than 0.5 mm but at least 50 µm.

12. The integrated optocoupler according to claim 1, wherein the emission wavelength of the transmitting area is at most 10% lower than the absorption edge of the receiver area.

13. The integrated optocoupler according to claim 1, wherein the transmitter component and receiver component are made of a III-V material.

14. The integrated optocoupler according to claim 1, wherein the receiver component comprises a GaAs and/or a Ge substrate.

15. The integrated optocoupler according to claim 1, wherein the receiver component comprises an AlGaAs or an GaAs or an InGaP or an InGaAs material.

16. The integrated optocoupler according to claim 1, wherein the receiver component and transmitter component have a truncated pyramidal design along the stack direction, and wherein the difference between the surface area of the bottom side of the truncated pyramid and the top side of the truncated pyramid is at least 5 µm².

17. The integrated optocoupler according to claim 1, wherein the surface of the transmitting area is arranged directly on the top side of the isolator and the surface of the receiving area directly on the bottom side of the isolator so that the surface of the transmitting area and the surface of the receiving area face one another.

18. The integrated optocoupler according to claim 1, wherein the offset between the two centroidal axes is less than a tenth of the distance of the particular centroidal axis to an outer edge of the surface of the transmitting area.

19. The integrated optocoupler according to claim 1, wherein the offset between the two centroidal axes is less than a fiftieth of the distance of the particular centroidal axis to an outer edge of the surface of the transmitting area.

20. The integrated optocoupler according to claim 1, wherein an outer edge of the surface of the receiving area is parallel with the outer edge of the surface of the transmitting area.

21. The integrated optocoupler according to claim 1, wherein the surface of the transmitting area and the surface of the receiving area are square and each has a base area larger than 0.2×0.2 mm² and smaller than 1 mm².

22. The integrated optocoupler according to claim 1, wherein a first substrate layer is provided adjacent to the rear surface of the transmitter component, and wherein a second substrate is provided adjacent to a rear surface of the receiver component, the second substrate being opposite the surface of the receiving area and opposite the electrical isolator.

23. A stacked optocoupler component comprising:
a transmitter component with a transmitting area, the transmitting area having a surface;
a receiver component with a receiving area, the receiving area having a surface;
an electrical isolator that is plate-shaped, the electrical isolator being formed between the transmitter component and the receiver component, and the transmitter component and receiver component and the electrical isolator being arranged one on top of another in a form of a stack,
wherein the transmitter component and receiver component are galvanically separated from one another but optically coupled to one another,
wherein the electrical isolator is transparent at least for a part of an emission wavelength of the transmitting area,
wherein a centroidal axis of the surface of the transmitting area and a centroidal axis of the surface of the receiving area are substantially parallel to one another,
wherein light from the transmitter component is emitted parallel to the centroidal axis of the surface of the transmitting area,
wherein an offset between the two centroidal axes is less than half of a distance of either centroidal axis to an outer edge of the surface of the transmitting area or the receiving area so that light of the transmitter component acts predominantly or solely through the electrical isolator on the receiving area,
wherein the electrical isolator projects on all sides from the stack to form a balcony,
wherein the receiver component has a number N of partial voltage sources connected in series to one another, N being a natural number greater or equal to 2, the receiver component receiving light parallel to the centroidal axis from the transmitter component across the electrical isolator,
wherein a deviation of the partial voltages of the individual partial voltage sources from one another is less than 20%,
wherein each partial voltage source has a semiconductor diode with a p-n junction,
wherein a tunnel diode is formed between each of two successive partial voltage sources,
wherein the partial voltage sources and the tunnel diodes are monolithically integrated together,
wherein the transmitter component has a substrate layer and the substrate layer of the transmitter component is arranged on the top side of the isolator and the receiver component has a substrate layer and the substrate layer of the receiver component is arranged on the bottom side of the isolator, so that the substrate layer of the receiver component and the substrate layer of the transmitter component face one another directly,
wherein light from the transmitter component is emitted parallel to the centroidal axis of the surface of the transmitting area,
wherein the receiver component receives light directly from the transmitter component across the electrical isolator,
wherein a transmitter electrical contact terminal is provided on the surface of the transmitting area, and a receiver electrical contact terminal is provided on the surface of the receiving area, and
wherein the transmitter electrical contact terminal and the receiver electrical contact terminal are a strip or grid pattern covering less than 10% of the surface of the transmitting area and the surface of the receiving area.

24. The integrated optocoupler according to claim 3, further comprising: a third electrical contact terminal disposed on the surface of the receiving area of the receiving component and a fourth contact terminal disposed on a rear surface of the receiving component, wherein the third electrical contact terminal and the fourth electrical contact terminal are a strip or grid pattern covering less than 10% of the surface of the receiver component and rear surface of the receiver component.

25. The integrated optocoupler according to claim 3, wherein the first electrical contact terminal and the second electrical contact terminal are directly opposite each other across the transmitter component.

* * * * *